United States Patent
Hencken et al.

(10) Patent No.: US 11,693,041 B2
(45) Date of Patent: Jul. 4, 2023

(54) METHOD FOR MONITORING THE ELECTRIC INSULATION STATUS OF A PIECE OF EQUIPMENT FOR MV OR HV ELECTRIC SYSTEMS

(71) Applicant: ABB Schweiz AG, Baden (CH)

(72) Inventors: Kai Hencken, Lörrach (DE); Joerg Lehmann, Basel (CH)

(73) Assignee: ABB Schweiz AG, Baden (CH)

( * ) Notice: Subject to any disclaimer, the term of this patent is extended or adjusted under 35 U.S.C. 154(b) by 35 days.

(21) Appl. No.: 17/320,451

(22) Filed: May 14, 2021

(65) Prior Publication Data

US 2021/0364566 A1    Nov. 25, 2021

(30) Foreign Application Priority Data

May 25, 2020   (EP) ..................... 20176260

(51) Int. Cl.
    *G01R 31/12* (2020.01)
(52) U.S. Cl.
    CPC .............................. *G01R 31/1272* (2013.01)
(58) Field of Classification Search
    CPC ................ G01R 31/1272; G01R 31/12; G01R 31/1227; G01R 31/1209; G01R 31/1218;
    (Continued)

(56) References Cited

U.S. PATENT DOCUMENTS

| | | | |
|---|---|---|---|
| 11,237,200 B2 * | 2/2022 | Wakabayashi | G01R 31/12 |
| 2008/0088314 A1 * | 4/2008 | Younsi | G01R 31/1227 324/457 |

(Continued)

FOREIGN PATENT DOCUMENTS

JP    2005331415 A  *  12/2005

OTHER PUBLICATIONS

C. Heitz, "A general stochastic approach to partial discharge processes," ICSD'98. Proceedings of the 1998 IEEE 6th International Conference on Conduction and Breakdown in Solid Dielectrics (Cat. No. 98CH36132), 1998, pp. 139-144, doi: 10.1109/ICSD. 1998.709245. (Year: 1998).*

(Continued)

*Primary Examiner* — Daniel R Miller
*Assistant Examiner* — Eric Sebastian Von Wald
(74) *Attorney, Agent, or Firm* — Armstrong Teasdale LLP

(57) ABSTRACT

A method for monitoring the electric insulation status of a piece of equipment for a medium-voltage or high-voltage electric system, which includes the following steps: acquiring detection data indicative of the behaviour of said piece of equipment, said detection data including a time sequence of measured discharge values related to partial-discharge events observed at subsequent observation instants in time; basing on said detection data, calculating stochastic data indicative of the electric insulation status of said piece of equipment, said stochastic data including probability values related to the observed partial-discharge events and calculated as a function of one or more characteristic parameters related to said partial-discharge events; basing on said stochastic data, calculating estimated data indicative of said one or more characteristic parameters related to said subsequent observation instants.

20 Claims, 1 Drawing Sheet

(58) Field of Classification Search
CPC .. G01R 31/18; G01R 31/3271; G01R 31/333; G01R 31/3274; G01R 31/3275; G01R 31/3646; G01R 31/3648; G01R 1/067; G01R 1/06777; G01R 1/06; G01R 1/073; G01R 31/14; G01R 31/16; G01R 31/1245; G01R 31/1263; G01R 15/00; G01R 15/14; G01R 15/144; G01R 15/18; G01R 15/16; G01R 15/165; H05K 1/0256; H05K 1/0254; H01H 2009/526; H01H 2239/044; H01R 12/00; H01B 17/00; Y10S 493/949; Y10S 292/59; Y10S 174/00; F28F 2265/24

See application file for complete search history.

(56) References Cited

U.S. PATENT DOCUMENTS

| | | | |
|---|---|---|---|
| 2014/0340096 A1 | 11/2014 | Rudolph | |
| 2014/0372051 A1* | 12/2014 | Sumi | G01R 31/1272 702/58 |
| 2015/0160284 A1* | 6/2015 | Cern | G01R 31/1272 324/536 |
| 2019/0285683 A1* | 9/2019 | Kim | G01R 31/50 |
| 2019/0383872 A1* | 12/2019 | Andie | G01R 31/14 |
| 2022/0128614 A1* | 4/2022 | Yamada | G01R 31/1272 |

OTHER PUBLICATIONS

Rocca, J. (Apr. 20, 2019). Ensemble methods: bagging, boosting and stacking. Towards Data Science. Retrieved Jan. 11, 2023, from https://towardsdatascience.com/ensemble-methods-bagging-boosting-and-stacking-c9214a10a205 (Year: 2019).*

European Patent Office, Extended Search Report issued in corresponding Application No. 20176260.6, dated Oct. 26, 2020, 11 pp.

Ahmed et al., "Multivariate Time Series Modeling for Long Term Partial Discharge Measurements in Medium Voltage XLPE Cables," 2019 Electrical Insulation Conference (EIC), Calgary, Alberta, Canada, Jun. 16-19, 2019, pp. 344-347.

Barbieri et al., "A Step Forward in the Characterization of the Partial Discharge Phenomenon and the Degradation of Insulating Materials Through Nonlinear Analysis of Time Series," IEEE Electrical Insulation Magazine, IEEE Service Center, New York, NY, vol. 28, No. 4, Jul. 1, 2012, pp. 14-21.

Pan et al., "Numerical Modeling of Partial Discharges in a Solid Dielectric-bounded Cavity: A Review," IEEE Transactions on Dielectrics and Electrical Insulation, vol. 26, No. 3, Jun. 2019, pp. 981-1000.

Wang et al., "Failure Rate Prediction Model of Substation Equipment Based on Weibull Distribution and Time Series Analysis," IEEE Access, vol. 7, Jul. 15, 2019, pp. 85298-85309.

Wenbin et al., "Improvement of insulation defect identification for DC XLPE cable by considering PD aging," Electrical Power and Energy Systems, vol. 114, Jul. 15, 2019, 9 pp.

* cited by examiner

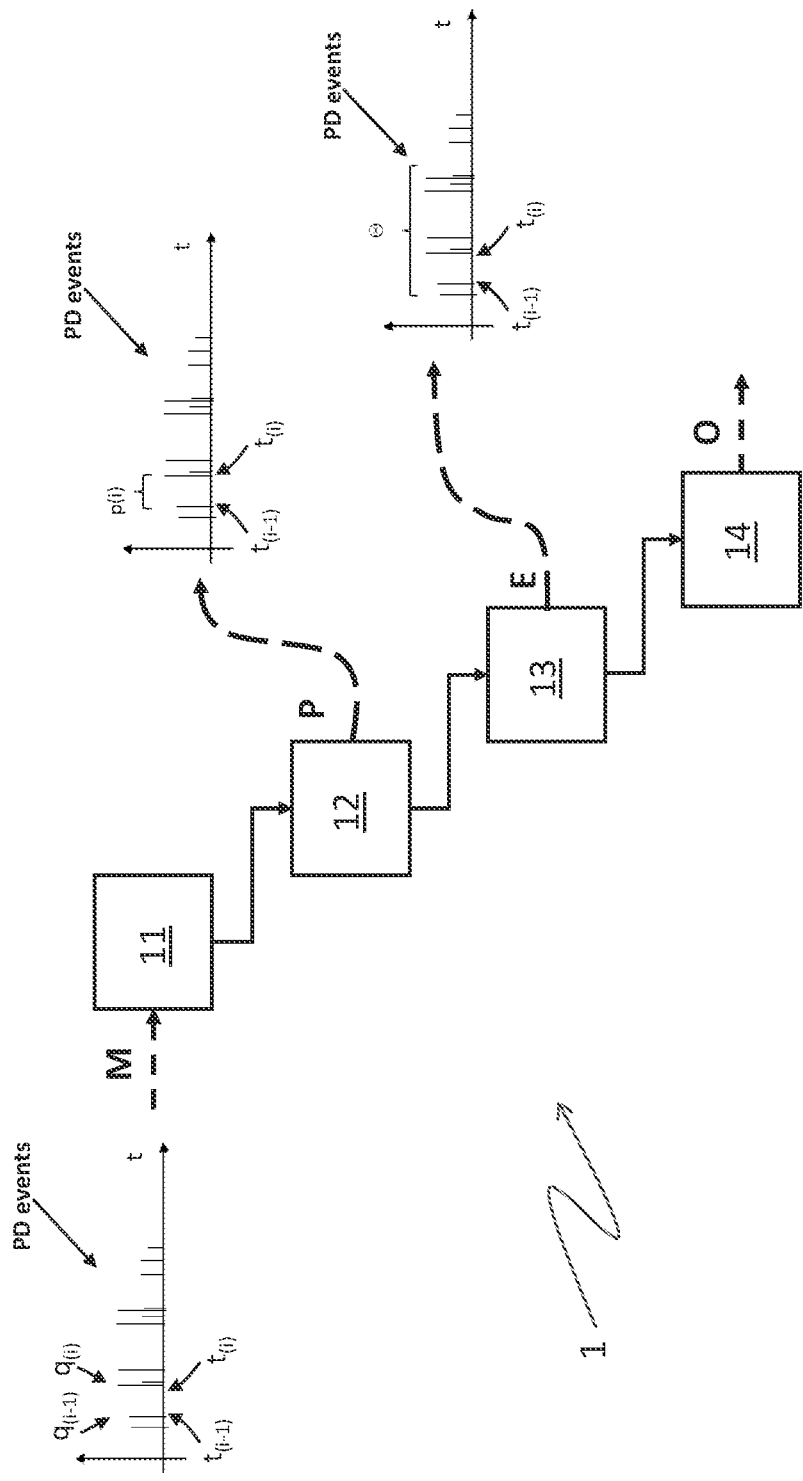

METHOD FOR MONITORING THE ELECTRIC INSULATION STATUS OF A PIECE OF EQUIPMENT FOR MV OR HV ELECTRIC SYSTEMS

BACKGROUND

The present invention relates to the field of medium or high voltage electric systems.

More particularly, the present invention relates to a method for monitoring the electric insulation status of a piece of equipment for medium-voltage (MV) or high-voltage (HV) electric systems.

As is known, the electric insulating material of a piece of equipment (e.g. a switching apparatus) of an electric system may have defects (e.g. void regions, surface contaminations, sharp edges) leading to a non-homogeneous distribution of the electric fields, when said piece of equipment is subject to an operating voltage.

In MV or HV electric systems, electric fields may locally become so strong that electric discharges not bridging to ground (normally referred to as "partial discharges") occur in the material or the atmosphere around it.

The occurrence of these phenomena is commonly considered as an indication that a fault (e.g. breakdown) in the electric insulating material is under development.

For this reason, several methods for monitoring the electric insulation conditions of a piece of equipment, which are based on partial discharge analysis, have been developed during the years.

A widespread class of solutions available in the state of the art includes monitoring methods based on a so-called PRPD (Phase-Resolved Partial Discharge) analysis.

Basically, the PRPD analysis provides for processing detection data indicative of the occurrence of partial-discharge events in such a way to obtain a two-dimensional density plot (also referred to as "q-ϕ scatter plot"). According to this graphic representation, partial-discharge events are shown in form of graphic patterns including sets of scatter points ($q_{(i)}$, $\phi_{(i)}$), where $q_{(i)}$ is a measured discharge value (typically a measured intensity value) related to a i-th partial-discharge event and $\phi_{(i)}$ is the phase of the voltage applied to the piece of the equipment at the observation instant (i) of said partial discharge event. By analysing these graphic patterns, an expert can obtain information about the nature of the partial-discharge events and understand whether a fault is present or developing.

Another popular class of solutions of the state of the art includes monitoring methods based on a so-called PSA (Pulse Sequence Analysis).

In this case, detection data indicative of the occurrence of partial-discharge events are processed in such a way to calculate correlation information related to the time distribution and/or the intensity distribution of a sequence of partial-discharge events, in particular pairs of subsequent partial-discharge events. A typical example of such correlation information is the correlation between consecutive measured discharge values $q_{(i)}$, $q_{(i-1)}$ for subsequent observation instants $t_{(i)}$, $t_{(i-1)}$ or time delays between said observation instants or combinations thereof (the phase of the voltage applied to the piece of equipment is not considered anymore). An expert can analyse or visualize these correlation data to obtain information about the nature of the partial-discharge events and the development of possible faults.

A major challenge of currently available monitoring methods based on partial discharge analysis consists in that data collection and interpretation cannot be often carried out in an automated manner, thereby requiring time-consuming and labour-intensive data processing.

Additionally, the intervention of expert personnel or highly specialized professionals is often required, which can be very expensive from an industrial point of view.

The above-mentioned issues make the traditional monitoring methods rather unsuitable for continuously monitoring the electric insulation conditions of a piece of equipment. In fact, they are usually carried out only periodically in the field or in a test laboratory. This does not allow to exploit in full the amount of data made available by most recent continuous detection systems and/or continuously checking the evolution in time of potential defects of the piece of equipment.

In the state of the art, it is therefore quite felt the need for solutions capable of overcoming the technical issues described above and allowing to carry out, in an automated manner, a reliable monitoring activity of the electric insulation status of a piece of equipment by using partial discharge analysis.

SUMMARY

In order to respond to this need, the present invention provides a method for monitoring the electric insulation status of a piece of equipment for medium-voltage or high-voltage electric systems, according to the following claim 1 and the related dependent claims.

In a general definition, the method, according to the invention, comprises the following steps:

acquiring detection data indicative of the behaviour of said piece of equipment, said detection data including a time sequence of measured discharge values related to partial-discharge events observed at subsequent observation instants in time;

basing on said detection data, calculating stochastic data indicative of the electric insulation status of said piece of equipment, said stochastic data including probability values related to the observed partial-discharge events and calculated as a function of one or more characteristic parameters related to said partial-discharge events;

basing on said stochastic data, calculating estimated data indicative of said one or more characteristic parameters related to said partial-discharge events.

According to an aspect of the invention, the method of the invention comprises a step of processing said estimated data to provide monitoring data indicative of the electric insulation status of said piece of equipment.

Preferably, said detection data include voltage detection values related to the amplitude, the phase, or the time-dependent value of the operating voltage applied to said piece of equipment.

Preferably, the step of calculating said stochastic data includes calculating, for one or more pairs of partial-discharge events, each having first and second measured discharge values and observed at consecutive first and second observation instants, a conditional probability value indicative of the probability of having a partial-discharge event with said second measured discharge value at said second observation instant given the fact that a partial-discharge event with said first measured discharge value has occurred at said first observation instant.

Conveniently, said conditional probability value is calculated as a function of said one or more characteristic parameters related to said partial-discharge events.

Preferably, calculating said conditional probability value includes calculating a first probability value indicative of the probability of having a partial-discharge event at said second observation instant independently from the measured discharge value of said partial-discharge event.

Preferably, calculating said conditional probability value includes calculating a second probability value indicative of the probability of having a partial-discharge event with the second discharge value measured at said second partial-discharge event.

Preferably, the step of calculating said stochastic data includes calculating, for one or more pairs of partial-discharge events, each observed at consecutive first and second observation instants, a combined conditional probability value basing on the conditional probability values calculated for each pair of partial-discharge events, said combined conditional probability value being calculated as a function of said one or more characteristic parameters.

Preferably, the step of calculating said estimated data includes calculating, for one or more pairs of partial-discharge events, each observed at consecutive first and second observation instants, one or more estimated values of said one or more characteristic parameters basing on said combined conditional probability values calculated for said one or more pairs of partial-discharge events.

According to some embodiments of the invention, the step of calculating said monitoring data includes processing one or more estimated values included in said estimated data and related to said one or more characteristic parameters to check the evolution in time of said one or more characteristic parameters.

According to some embodiments of the invention, the step of calculating said monitoring data includes processing one or more estimated values included in said estimated data and related to said one or more characteristic parameters to carry out a classification of said one or more characteristic parameters.

According to some embodiments of the invention, the step of calculating said monitoring data includes processing one or more estimated values included in said estimated data and related to said one or more characteristic parameters to simulate the behaviour of said piece of equipment when subject to partial-discharge events under different conditions.

BRIEF DESCRIPTION OF THE FIGURE

Further characteristics and advantages of the monitoring method, according to the present invention, will become more apparent from the detailed description of preferred embodiments illustrated only by way of non-limitative example in the accompanying drawings, in which the only FIG. 1 is a block diagram that schematically shows the steps of the method, according to the present invention.

DETAILED DESCRIPTION

Referring to the cited FIGURES, the present invention is related to a method 1 for monitoring the electric insulation status of a piece of equipment (not shown) for medium-voltage or high-voltage electric systems.

For the purposes of the present invention, the term "medium voltage" (MV) relates to operating voltages higher than 0.6 kV AC and 1.5 kV DC up to some tens of kV, e.g. up to 69 kV AC and 100 kV DC whereas the term "high voltage" (HV) relates to higher operating voltages.

For the purposes of the present invention, the term "equipment" relates to of any apparatus intended for use in a MV or HV electric system, e.g. a switching apparatus, a switchgear, a switchboard, a power or distribution transformer, an electric motor, a switching converter, an electric grid section and the like.

For the purposes of the present invention, the term "piece of equipment" relates to of any component intended for use in an apparatus for MV or HV electric systems, provided that such a component comprises an electric insulation material subject to electric fields in operation.

According to the invention, the monitoring method 1 comprises a step 11 of acquiring detection data M indicative of the behavior of the piece of equipment when this latter is subject to an operating voltage.

Preferably, the detection data M include measured discharge values $q_{(i)}$ related to partial-discharge events observed at subsequent observation instants $t_{(i)}$ (FIG. 1).

Said measured discharge values may include measured intensity values (e.g. the peak strength values) of the observed partial-discharge events or other measured values describing the observed partial-discharge events (e.g. the pulse shape and/or the pulse width, and the like) or combinations thereof.

Preferably, the detection data M include also voltage detection values related to the amplitude $U_0$, the phase $\phi(t)$, or the time-dependent value $U(t)$ of the operating voltage applied to the piece of equipment.

Conveniently, said voltage detection values include the voltage values $U_{(i)}$ and the phase values $\phi_{(i)}$ measured at said observation instants and, preferably, also the voltage $U(t)$ or phase $\phi(t)$ values at the time intervals between the discharge instances.

Detection data M may be collected by employing a variety of measuring sensors, e.g. capacitive sensors, inductive sensors, UHF sensors, acoustic sensors or the like.

In general, the step 11 of the method of the invention may be carried out according to measuring and/or acquisition techniques or solutions of known type. Thus, hereinafter, it will be not described in further details, for the sake of brevity.

Preferably, before being used in subsequent steps of the method of the invention, the detection data M are processed to reduce or compensate the influence of noise or other disturbances. To this aim, suitable post-processing or filtering techniques of known type may be used.

According to the invention, the monitoring method 1 comprises a step 12 of calculating, basing on the detection data M, stochastic data P indicative of the electric insulation status of the piece of equipment as a function of one or more characteristic parameters θ related to the partial-discharge events observed at the subsequent observation instants.

The rationale for the step 12 of the method of the invention can be found in the circumstance that, according to the detection data M, the observed sequence of partial-discharge events at subsequent observation instants may be seen a stochastic point process, in which each point of the process is represented by a set (e.g. a pair) of values ($q_{(i)}$, $t_{(i)}$), where $q_{(i)}$ are one or more measured discharge values characteristic of a partial-discharge event (included in the detection data M) and $t_{(i)}$ is the corresponding detected observation instant.

The step 12 of the method of the invention is therefore directed to establish a correlation between the observed partial-discharge events (points of the stochastic process) and a characteristic process (described by the characteristic parameters θ occurring in the electric insulation material of the piece of equipment and underlying said partial-discharge events.

Selectable characteristic parameters θ to describe the above-mentioned characteristic process may include the discharge inception voltage, the discharge residual voltage, parameters describing relations between voltage drops in the defect resulting from said partial-discharge event and the measured discharge values of the observed partial-discharge events, parameters describing relations between an overvoltage above the discharge inception voltage and the occurrence of said partial-discharge events, time constants describing the internal dynamics of the defect between discharges, and the like.

As is easy to understand, most of the characteristic parameters θ (e.g. the above-mentioned discharge inception voltage) are directly linked to the voltage value U(t) or phase φ(t) of the operating voltage applied to the piece of equipment. Some of these characteristic quantities need therefore to be known to carry out the above-mentioned step of the invention.

Preferably, the step 12 of the method of the invention comprises calculating, for one or more pairs of partial-discharge events, each having first and second measured discharge values $q_{(i-1)}$, $q_{(i)}$ and observed at consecutive first and second observation instants $t_{(i-1)}$, $t_{(i)}$, a conditional probability value $p_{(i)}$ establishing a correlation between such a pair of partial-discharge events. The conditional probability value $p_{(i)}$ is indicative of the probability of having a partial-discharge event with the second measured discharge value $q_{(i)}$ at the second observation instant $t_{(i)}$ (subsequent instant) of said pair of partial-discharge events given the fact that a partial-discharge event with the first measured discharge value $q_{(i-1)}$ has occurred at the first observation instant $t_{(i-1)}$ (preceding instant) of said pair of partial-discharge events.

The conditional probability value $p_{(i)}$ is calculated as a function of the one or more characteristic parameters θ selected to describe the characteristic process underlying the partial-discharge events. In practice, the conditional probability value $p_{(i)}$, for each pair of partial-discharge events, may be expressed by the following relation:

$$p_{(i)} = p(t_{(i)}, q_{(i)} | t_{(i-1)}, q_{(i-1)}, \theta)$$

where $t_{(i-1)}$, $t_{(i)}$ are the above-mentioned first and second consecutive observation instants, $q_{(i-1)}$, $q_{(i)}$ are the first and second discharge values measured at said first and second observation instants and θ are the above-mentioned one or more characteristic parameters.

The conditional probability value $p_{(i)}$ for each pair of partial-discharge events may be calculated by adopting a variety of mathematic models (which may be of known type).

For most of the applications of the method of the invention, a so-called semi-Markov mathematical model can be conveniently adopted.

Preferably, the calculation of the conditional probability value $p_{(i)}$ includes calculating a first probability value $p1_{(i)}$ indicative of the probability of having a partial-discharge event at the second observation instant $t_{(i)}$ of each pair of partial-discharge events independently from the measured discharge values of said partial-discharge events.

The first probability value $p1_{(i)}$ may conveniently be calculated as:

$$p1_{(i)} = c(t_i) \exp(-\int_{t_{i-1}}^{t_i} c(t') dt')$$

where $c(t) = c(t, t_{(i-1)}, q_{(i-1)}, U(t), \theta)$ is an event rate function that depends on one or more measured quantities included in the detection data M, including the measured discharge value $q_{(i-1)}$ of the partial-discharge event at the first observation instant $t_{(i-1)}$, the value U(t) of the operating voltage applied to the piece of equipment and the one or more characteristic parameters θ.

It is evident how the first probability value $p1_{(i)}$ describes the waiting time distribution of the above-mentioned semi-Markov mathematical model.

Preferably, the calculation of the conditional probability value $p_{(i)}$ further includes calculating a second probability value $p2_{(i)}$ indicative of the probability of having a partial-discharge event with the second discharge value $q_{(i)}$, which has been measured at the second observation value of each pair of partial-discharge events.

Conveniently, the second probability value $p2_{(i)}$ may be calculated as:

$$p2_{(i)} = p(q_{(i)} | t_{(i)}, t_{(i-1)}, q_{(i-1)}, U(t), \theta)$$

where $q_{(i)}$, $q_{(i-1)}$ are the measured discharge values related to the partial-discharge events, U(t) is the amplitude of the operating voltage applied to the piece of equipment and θ are the one or more characteristic parameters.

The above-mentioned conditional probability value $p_{(i)}$ can be calculated by combining the calculated first and second probability values $p1_{(i)}$, $p2_{(i)}$. In particular, due to the semi-Markovian nature of the analyzed partial-discharge process, the conditional probability value $p_{(i)}$ may be conveniently be calculated as:

$$p_{(i)} = p1_{(i)} * p2_{(i)}$$

Preferably, the step 12 of the method of the invention comprises calculating, for one or more pairs of partial-discharge events, each observed at consecutive first and second observation instants $t_{(i-1)}$, $t_{(i)}$, a combined conditional probability value pT establishing a correlation between said pairs of partial-discharge events.

The combined conditional probability value pT is calculated basing on the conditional probability values $p_{(i)}$ calculated for each pair of partial-discharge events.

The combined conditional probability value pT is calculated as a function of said one or more characteristic parameters. In practice, the combined conditional probability value pT, for each pair of partial-discharge events, may be expressed by the following relation:

$$pT = \prod_i p_i$$

where $p_{(i)}$ is the conditional probability value calculated for each pair of partial-discharge events taken into consideration.

Preferably, the combined conditional probability value pT is calculated for a plurality of pairs of events. It is however evident that the combined conditional probability value pT is equal to the conditional probability value $p_{(i)}$, if a single pair of partial-discharge events is taken into consideration.

According to the invention, the monitoring method 1 comprises a step 13 of calculating, basing on the stochastic data P, estimated data E indicative of the above-mentioned one or more characteristic parameters θ in the time interval between said subsequent observation instants.

Conveniently, the step 13 of the method of the invention provides for calculating the characteristic parameters θ related to the observed partial-discharge events. Therefore, it allows obtaining a quantitative description of the characteristic process occurring in the electric insulation material of the piece of equipment and underlying the observed partial-discharge events.

Preferably, the calculation of the estimated data E includes calculating, for one or more pairs of partial-discharge events, each observed at consecutive first and second observation instants $t_{(i-1)}$, $t_{(i)}$, one or more estimated values $\hat{\Theta}$ of the one or more characteristic parameters θ basing on the combined conditional probability values pT calculated for said one or more pairs of partial-discharge events.

Preferably, the one or more estimated values $\hat{\Theta}$ are calculated for a plurality of pairs of partial-discharge events. However, they may be calculated for a single pair of partial-discharge events.

The calculation of the estimated values $\hat{\Theta}$ related to the characteristic parameters θ may be carried out through suitable parameter estimated techniques of known type.

As an example, a MLE (Maximum Likelihood Estimator) method or a similar estimation method may be used according to the needs.

In this case, the calculation of said estimated data E includes calculating, for each pair of partial-discharge events, a logarithmic function l(Θ) basing on the above-mentioned conditional probability values $p_{(i)}$. Such a logarithmic function l(θ) may be calculated as:

$$l(\Theta) = \log(pT) = \sum_i \log(p(t_{(i)}, q_{(i)} \mid t_{(i-1)}, q_{(i-1)}, \Theta))$$

wherein pT is the combined conditional probability value calculated for said one or more pairs of partial-discharge events.

The one or more estimated values $\hat{\Theta}$ may be calculated by suitably processing the above-mentioned logarithmic function l(Θ), for example through an optimization procedure.

The one or more estimated values $\hat{\Theta}$ may thus be calculated as:

$$\hat{\Theta} = \mathrm{argmax}_\theta l(\Theta)$$

According to preferred embodiments of the invention, the monitoring method 1 comprises a step 14 of processing the estimated data E to provide monitoring data O indicative of the electric insulation status of the monitored piece of equipment.

As they provide a quantitative description of the characteristic reason underlying the partial-discharge events, the calculated estimated values $\hat{\Theta}$ of the characteristic parameters θ can, in fact, be used to obtain information O related to the electric insulation conditions of the piece of equipment.

Conveniently, this step of the method of the invention may be carried according to a variety of solutions (not necessarily alternative one to another), which will be described in more details in the following.

According to an embodiment of the invention, the step 14 of processing the estimated data E includes processing the calculated estimated values $\hat{\Theta}$ related to the characteristic parameters θ to check the evolution in time of said characteristic parameters.

Preferably, the estimated values $\hat{\Theta}$ are processed through prognostic or prediction models (which may be of known type). In this way, it is possible to obtain information related to the electric insulation conditions of the monitored piece of equipment and possibly developing faults (breakdown of the insulation material) by analysing the trend of said characteristic parameters.

As an example, the estimated values $\hat{\Theta}$ may be processed to predict the point in time, in which they reach a predefined critical value calculated based on available experimental data.

As another example, the estimated values $\hat{\Theta}$ may be processed to detect possible variations indicative of corresponding changes of type and class of the physical process underlying the observed partial-discharge events. Predictive information related to the remaining lifetime of the piece of equipment may be obtained basing on the identified type and class of the physical process occurring in the electric insulation material.

As another example, machine learning techniques may be used to compare the time evolution of the estimated values $\hat{\Theta}$ with a set of predefined trends in time of the characteristic parameters θ until a fault occurs. In this way, the best predefined trend to predict of the time until failure of the piece of equipment may be identified.

Similarly, machine learning techniques may be used to compare the evolution in time of the estimated values $\hat{\Theta}$ with historical detection data related to a number of pieces of equipment similar to the piece of equipment under monitoring. In this way, the remaining lifetime of the piece of the equipment may be predicted through suitable outlier detection techniques.

According to another embodiment of the invention, the step 14 of processing the estimated data E includes processing the calculated estimated values $\hat{\Theta}$ related to classify the characteristic parameters θ according to predefined classification rules. Conveniently, said classification rules are set in such a way to determine the electric insulation status of the piece of equipment basing on the values taken by said characteristic parameters.

In general, this solution may be realized in practice according to classification techniques of known type. For example, look-up tables specifying suitable ranges for the characteristic parameters θ may be used. As an alternative, the classification of the characteristic parameters θ may be carried out through a suitably trained AI (Artificial Intelligence) or ML (Machine Learning) engines or neural networks.

According to another embodiment of the invention, the step 14 of processing the estimated data E includes processing the calculated estimated values $\hat{\Theta}$ to simulate (through suitable simulation models that may be of known type) the behavior of the piece of equipment when subject to partial-discharge events under different conditions.

As example, it can be simulated the effects on the partial-discharge events, which are caused by changes in some external conditions related to the operating life of the piece of equipment, e.g. a change in the amplitude of the voltage applied to the piece of equipment, a change in the frequency of the voltage applied to the piece of equipment, and the like.

Simulated sets of data indicative of the behavior of the piece of equipment (which are similar to the above-mentioned detection data M) subject to partial discharge events may be obtained and used for generating simulated PRDP or PSA representations of a sequence of partial-discharge events.

Where appropriate, these simulated PRPD or PSA representations of a sequence of partial-discharge events may be compared with PRPD or PSA representations directly obtained by processing the detection data M through a traditional partial-discharge analysis.

The monitoring method, according to the invention, is particularly adapted for AC medium-voltage or high-voltage electric systems and it will be described with particular reference to this kind of applications. However, differently from other monitoring methods based on a partial discharge analysis (e.g. based on PRPD analysis), it may be used also in electric systems of different types, e.g. in DC medium-voltage electric systems or low-voltage electric systems.

In certain electric systems (e.g. in MV variable frequency motors or in some MV converters), the operating voltage of the monitored piece of equipment does not have a constant frequency or amplitude. Experimental tests have however shown how the calculated one or more characteristic parameters θ underlying the observed partial-discharge events are not strongly dependent on frequency. Additionally, in order to compensate possible changes of the amplitude of the operating voltage of the monitored piece of equipment, the calculated estimated values $\hat{\Theta}$ related to the characteristic parameters θ may be processed according to suitable compensation techniques (which may be of known type).

Conveniently, if the monitoring activity of the piece of the equipment is not carried out on the field (e.g. in a test laboratory), the method, according to the invention, may be cyclically executed for different levels of frequency and amplitude of the operating voltage applied to the piece of equipment. Additionally, the calculated estimated values $\hat{\Theta}$ may be processed to explore wider ranges of characteristic parameters θ.

The monitoring data O so obtained may be combined to obtain more reliable information on the electric insulation status of the piece of equipment.

The monitoring method 1, according to the invention, is particularly suitable for being implemented by a computerised device or platform.

In a further aspect, the present invention thus relates to a computer program comprising software instructions to carry out the method 1, according to the invention. Such a computer program is stored or storable in a storage medium, e.g. in a memory of the computerised device.

In a further aspect, the present invention further relates to a computerised device or platform comprising computerised resources (e.g. one or more microprocessors) configured to execute software instructions to carry out the method, according to the invention. Such a computerized device may be a stand-alone device or be part of a monitoring apparatus for monitoring a medium-voltage or high-voltage electric system and/or be part of a computing architecture operating at remote level (e.g. at cloud level) and communicating with such a monitoring apparatus.

The monitoring method, according to the invention, provides several advantages with respect to traditional monitoring methods based on a partial discharge analysis.

The monitoring method, according to the invention, allows obtaining reliable information about the electric insulation status of a piece of equipment, particularly in relation to possible developing faults of the electric insulation material.

The monitoring method, according to the invention, can be carried out in a fully automated manner without employing time-consuming and labour-intensive data processing techniques.

The monitoring method, according to the invention, allows collecting information about the electric insulation status of a piece of equipment without requiring the intervention of highly specialized personnel. This allows remarkably reducing the costs for monitoring the operating conditions of an electric system.

The monitoring method, according to the invention, does not require huge computing resources for being implemented in practice. Therefore, it may be easily implemented at industrial level, at competitive costs with the currently available technical solutions of the state of the art.

The invention claimed is:

1. A method for monitoring the electric insulation status of a piece of equipment for a medium-voltage or high-voltage electric system comprising:
   acquiring detection data indicative of a behaviour of said piece of equipment, said detection data including a time sequence of measured discharge values related to partial-discharge events observed at subsequent observation instants in time;
   basing on said detection data, calculating stochastic data including probability values indicative of the electric insulation status of said piece of equipment, the probability values related to the observed partial-discharge events and calculated as a function of one or more characteristic parameters related to said partial-discharge events, wherein calculating stochastic data further comprises:
   calculating, for each of pairs of partial-discharge events, a conditional probability value of a second partial-discharge event of the pair at a second instant with a second discharge value, given that a first partial-discharge event of the pair with a first discharge value has occurred at a first instant; and
   calculating the probability values as a combined conditional probability value of the conditional probability values of the pairs; and
   basing on said combined conditional probability value, calculating estimated data indicative of said one or more characteristic parameters related to said subsequent observation instants.

2. The method, according to claim 1, further comprising an act of processing said estimated data to provide monitoring data indicative of the electric insulation status of said piece of equipment.

3. The method, according to claim 2, wherein said detection data include voltage detection values related to an amplitude, a phase, or a time-dependent value of an operating voltage applied to said piece of equipment.

4. The method, according to claim 3, wherein the act of calculating said stochastic data includes calculating, for one or more pairs of partial-discharge events, each having first and second measured discharge values and observed at consecutive first and second observation instants, the conditional probability value indicative of a probability of having a partial-discharge event with said second measured discharge value at said second observation instant given the fact that a partial-discharge event with said first measured discharge value has occurred at said first observation instant, said conditional probability value being calculated as a function of said one or more characteristic parameters.

5. The method, according to claim 4, wherein calculating said conditional probability value includes calculating a first probability value indicative of the probability of having a partial-discharge event at said second observation instant independently from the discharge value of said partial-discharge event.

6. The method, according to claim 4, wherein calculating said conditional probability value includes calculating a second probability value indicative of the probability of having a partial-discharge event with the second discharge value measured at a second observation instant.

7. The method, according to claim 6, wherein the act of calculating said stochastic data includes calculating, for one or more pairs of partial-discharge events, each observed at consecutive first and second observation instants, the combined conditional probability value basing on the conditional probability values calculated for each pair of partial-discharge events, said combined conditional probability value being calculated as a function of said one or more characteristic parameters.

8. The method, according to claim 7, wherein the act of calculating said estimated data includes calculating, for one or more pairs of partial-discharge events, each observed at consecutive first and second observation instants, one or more estimated values of said one or more characteristic parameters basing on said combined conditional probability values calculated for said one or more pairs of partial-discharge events.

9. The method, according to claim 2, wherein the act of calculating said monitoring data includes processing one or more estimated values included in said estimated data and related to said one or more characteristic parameters to check an evolution in time of said characteristic parameters.

10. The method, according to claim 2, wherein the act of calculating said monitoring data includes processing one or more estimated values included in said estimated data and related to said one or more characteristic parameters to carry out a classification of said characteristic parameters.

11. The method, according to claim 2, wherein the act of calculating said monitoring data includes processing one or more estimated values included in said estimated data and related to said one or more characteristic parameters to simulate the behaviour of said piece of equipment when subject to partial-discharge events under different conditions.

12. The method, according to claim 1, wherein said detection data include voltage detection values related to an amplitude, a phase, or a time-dependent value of an operating voltage applied to said piece of equipment.

13. The method, according to claim 1, wherein the act of calculating said stochastic data includes calculating, for one or more pairs of partial-discharge events, each having first and second measured discharge values and observed at consecutive first and second observation instants, a conditional probability value indicative of a probability of having a partial-discharge event with said second measured discharge value at said second observation instant given the fact that a partial-discharge event with said first measured discharge value has occurred at said first observation instant, said conditional probability value being calculated as a function of said one or more characteristic parameters.

14. The method, according to claim 13, wherein the act of calculating said stochastic data includes calculating, for one or more pairs of partial-discharge events, each observed at consecutive first and second observation instants, a combined conditional probability value basing on the conditional probability values calculated for each pair of partial-discharge events, said combined conditional probability value being calculated as a function of said one or more characteristic parameters.

15. The method, according to claim 5, wherein calculating said conditional probability value includes calculating a second probability value indicative of the probability of having a partial-discharge event with the second discharge value measured at a second observation instant.

16. The method, according to claim 8, wherein the act of calculating said monitoring data includes processing one or more estimated values included in said estimated data and related to said one or more characteristic parameters to check the evolution in time of said characteristic parameters.

17. The method, according to claim 9, wherein the act of calculating said monitoring data includes processing one or more estimated values included in said estimated data and related to said one or more characteristic parameters to carry out a classification of said characteristic parameters.

18. A computer program, which is stored in a non-transitory storage medium, comprising software instructions configured to be implemented by a processor to
  acquire detection data indicative of a behaviour of a piece of equipment, said detection data including a time sequence of measured discharge values related to partial-discharge events observed at subsequent observation instants in time;
  based on said detection data, calculating stochastic data indicative of an electric insulation status of said piece of equipment, said stochastic data including probability values related to the observed partial-discharge events and calculated as a function of one or more characteristic parameters related to said partial-discharge events;
  based on said stochastic data, calculate estimated data indicative of said one or more characteristic parameters related to said subsequent observation instants,
    wherein calculating estimated data further comprises calculating, for one or more pairs of partial-discharge events, each observed at consecutive first and second observation instants, one or more estimated values of the one or more characteristic parameters basing on combined conditional probability values calculated for the one or more pairs of partial-discharge events.

19. A computerized device or platform comprising:
  a processor configured to execute software instructions stored in a non-transitory storage medium to implement the following:
    acquire detection data indicative of a behaviour of a piece of equipment, said detection data including a time sequence of measured discharge values related to partial-discharge events observed at subsequent observation instants in time;
    based on said detection data, calculating stochastic data indicative of an electric insulation status of said piece of equipment, said stochastic data including probability values related to the observed partial-discharge events and calculated as a function of one or more characteristic parameters related to said partial-discharge events;
    based on said stochastic data, calculate estimated data indicative of said one or more characteristic parameters related to said subsequent observation instants,
      wherein calculating estimated data further comprises calculating, for one or more pairs of partial-discharge events, each observed at consecutive first and second observation instants, one or more estimated values of the one or more characteristic parameters basing on combined conditional probability values calculated for the one or more pairs of partial-discharge events.

20. A monitoring apparatus for monitoring a medium-voltage or high-voltage electric system comprising a computerised device or platform according to claim 19.

* * * * *